US011906610B2

(12) United States Patent
Bentley et al.

(10) Patent No.: US 11,906,610 B2
(45) Date of Patent: Feb. 20, 2024

(54) OFFSET CALIBRATION AND DIAGNOSTICS FOR RESISTANCE-BASED BRIDGE CIRCUITS

(71) Applicant: Honeywell International Inc., Charlotte, NC (US)

(72) Inventors: Ian Bentley, New Ipswich, NH (US); Richard Bishop, Charlotte, NC (US); Richard Kirkpatrick, Charlotte, NC (US)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 65 days.

(21) Appl. No.: 17/197,789

(22) Filed: Mar. 10, 2021

(65) Prior Publication Data

US 2022/0291322 A1  Sep. 15, 2022

(51) Int. Cl.
*G01R 35/00* (2006.01)
*G01R 31/54* (2020.01)
*G01F 25/10* (2022.01)
*G01L 27/00* (2006.01)
*G01N 27/82* (2006.01)
*G01R 17/10* (2006.01)

(52) U.S. Cl.
CPC .......... *G01R 35/007* (2013.01); *G01F 25/13* (2022.01); *G01L 27/005* (2013.01); *G01N 27/82* (2013.01); *G01R 17/105* (2013.01); *G01R 31/54* (2020.01)

(58) Field of Classification Search
CPC .... G01R 35/007; G01R 17/105; G01R 31/54; G01F 25/13; G01L 27/005; G01N 27/82
See application file for complete search history.

(56) References Cited

U.S. PATENT DOCUMENTS 3,433,068 A * 3/1969 Werner ................ G01F 1/6847
   73/204.19
3,625,049 A * 12/1971 Davey ................. G01M 3/3254
   73/49.2

(Continued)

FOREIGN PATENT DOCUMENTS

FR    2837570 A1 *  9/2003  ............ G01D 3/08
JP    4487416 B2 *  6/2010  ............ G01D 3/08

OTHER PUBLICATIONS

Orbis TM Rotary Absolute Magnetic Encoder Module. RLS: Rotary and Linear Motion Sensore, www.rls.si/eng/orbis-true-absolute-rotary-encoder. Accessed Jun. 9, 2021.

(Continued)

*Primary Examiner* — Alexander Satanovsky
*Assistant Examiner* — Asm Fakhruddin
(74) *Attorney, Agent, or Firm* — ALSTON & BIRD LLP (57) ABSTRACT

Methods, apparatuses and systems for providing offset calibration and fault monitoring are disclosed herein. An example controller component may comprise: a resistance-based bridge circuit; a signal conditioning circuit configured to condition an output of the resistance-based bridge circuit; a first diagnostic circuit coupled to the signal conditioning circuit configured to monitor an output of a first branch of the resistance-based bridge circuit; and a second diagnostic circuit coupled to the signal conditioning circuit configured to monitor an output of a second branch of the resistance-based bridge circuit.

18 Claims, 6 Drawing Sheets

(56) References Cited

U.S. PATENT DOCUMENTS

| | | | | |
|---|---|---|---|---|
| 5,798,641 | A * | 8/1998 | Spagna | G01N 27/72 |
| | | | | 324/228 |
| 6,091,987 | A * | 7/2000 | Thompson | G05F 3/242 |
| | | | | 607/2 |
| 6,972,558 | B1 | 12/2005 | Robinson | |
| 7,391,206 | B2 * | 6/2008 | Haga | B82Y 25/00 |
| | | | | 324/207.2 |
| 10,488,225 | B2 | 11/2019 | Ausserlechner | |
| 2004/0055374 | A1 * | 3/2004 | Cohen | G01F 1/698 |
| | | | | 73/204.11 |
| 2006/0283236 | A1 | 12/2006 | Trescott et al. | |
| 2010/0011852 | A1 * | 1/2010 | Andonian | B60C 11/02 |
| | | | | 73/146.5 |
| 2015/0331016 | A1 * | 11/2015 | Malhan | G01L 25/00 |
| | | | | 324/706 |
| 2017/0059360 | A1 | 3/2017 | Zimmer et al. | |
| 2017/0269036 | A1 | 9/2017 | Foord | |
| 2017/0343608 | A1 | 11/2017 | Keser et al. | |
| 2019/0107586 | A1 | 4/2019 | Bilbao De Mendizabal et al. | |
| 2020/0294401 | A1 | 9/2020 | Kerecsen | |
| 2021/0003614 | A1 | 1/2021 | Esaka et al. | |

OTHER PUBLICATIONS

European search report dated Jul. 7, 2022 for EP Application No. 22157451.
European search report dated Jul. 15, 2022 for EP Application No. 22157451.

* cited by examiner

OFFSET CALIBRATION AND DIAGNOSTICS FOR RESISTANCE-BASED BRIDGE CIRCUITS

BACKGROUND

Apparatuses and components comprising resistance-based bridge circuits (e.g., Wheatstone bridge circuits) may be used in a variety of applications. For example, many sensing components (e.g., flow sensing components, pressure sensing components and the like) may include such resistance-based bridge circuits. Many sensing components are plagued by technical challenges and limitations.

Through applied effort, ingenuity, and innovation, many of these identified problems have been solved by developing solutions that are included in embodiments of the present disclosure, many examples of which are described in detail herein.

BRIEF SUMMARY

Various embodiments described herein relate to resistance-based bridge circuits and to sensing methods, apparatuses, and systems (e.g., flow sensing components and pressure sensing components having sensing elements comprising resistance-based bridge circuits).

In accordance with various examples of the present disclosure, a controller component is provided. The example controller component may comprise: a resistance-based bridge circuit; a signal conditioning circuit configured to condition an output of the resistance-based bridge circuit; a first diagnostic circuit coupled to the signal conditioning circuit configured to monitor an output of a first branch of the resistance-based bridge circuit; and a second diagnostic circuit coupled to the signal conditioning circuit configured to monitor an output of a second branch of the resistance-based bridge circuit.

In accordance with various examples of the present disclosure, A method for providing offset calibration and detecting fault conditions using a controller component is provided. The method may comprise: monitoring, by a first diagnostic circuit of the controller component, a first branch of a resistance-based bridge circuit; and monitoring, by a second diagnostic circuit of the controller component, a second branch of the resistance-based bridge circuit, wherein the first diagnostic circuit and the second diagnostic circuit are electronically coupled to a signal conditioning circuit of the controller component, and the signal conditioning circuit is configured to condition an output of the resistance-based bridge circuit.

The foregoing illustrative summary, as well as other exemplary objectives and/or advantages of the disclosure, and the manner in which the same are accomplished, are further explained in the following detailed description and its accompanying drawings.

BRIEF DESCRIPTION OF THE DRAWINGS

The description of the illustrative embodiments may be read in conjunction with the accompanying figures. It will be appreciated that, for simplicity and clarity of illustration, elements illustrated in the figures have not necessarily been drawn to scale, unless described otherwise. For example, the dimensions of some of the elements may be exaggerated relative to other elements, unless described otherwise.

Embodiments incorporating teachings of the present disclosure are shown and described with respect to the figures presented herein, in which.

DETAILED DESCRIPTION OF THE INVENTION

Some embodiments of the present disclosure will now be described more fully hereinafter with reference to the accompanying drawings, in which some, but not all embodiments of the disclosure are shown. Indeed, these disclosures may be embodied in many different forms and should not be construed as limited to the embodiments set forth herein; rather, these embodiments are provided so that this disclosure will satisfy applicable legal requirements. Like numbers refer to like elements throughout.

The components illustrated in the figures represent components that may or may not be present in various embodiments of the present disclosure described herein such that embodiments may include fewer or more components than those shown in the figures while not departing from the scope of the present disclosure. Some components may be omitted from one or more figures or shown in dashed line for visibility of the underlying components.

The phrases "in an example embodiment," "some embodiments," "various embodiments," and the like generally mean that the particular feature, structure, or characteristic following the phrase may be included in at least one embodiment of the present disclosure, and may be included in more than one embodiment of the present disclosure (importantly, such phrases do not necessarily refer to the same embodiment).

The word "example" or "exemplary" is used herein to mean "serving as an example, instance, or illustration." Any implementation described herein as "exemplary" is not necessarily to be construed as preferred or advantageous over other implementations.

If the specification states a component or feature "may," "can," "could," "should," "would," "preferably," "possibly," "typically," "optionally," "for example," "often," or "might" (or other such language) be included or have a characteristic, that a specific component or feature is not required to be included or to have the characteristic. Such components or features may be optionally included in some embodiments, or may be excluded.

The terms "electronically coupled" or "in electronic communication with" in the present disclosure refer to two or more electrical elements (for example, but not limited to, an example processing circuitry, communication element, input/output element, memory, flame detecting component) and/or electric circuit(s) being connected through wired means (for example but not limited to, conductive wires or traces) and/or wireless means (for example but not limited to, wireless network, electromagnetic field), such that data and/or information (for example, electronic indications, signals) may be transmitted to and/or received from the electrical elements and/or electric circuit(s) that are electronically coupled.

The term "sensing component" may refer to a device (e.g., pressure sensing component, flow sensing component, magnetic-based sensing component, or the like) that is configured to detect/measure a mechanical output. In one example, a pressure sensing component may comprise a diaphragm and strain gages. The example diaphragm may be configured to deflect in response to an applied pressure causing a change in resistance(s) of the strain gages. Accordingly, the example pressure sending component may be configured to produce an output voltage or output current that is proportional to the detected mechanical pressure. In various embodiments, sensing components may comprise resistance-based bridge circuits (e.g., a Wheatstone bridge circuit) configured to detect/measure physical parameters (e.g., pressure).

By way of example, a pressure sensing component may comprise a Wheatstone bridge circuit excited by a constant voltage or current so as to produce an electrical output/signal. In response to an applied pressure, a first pair of strain gages of the example Wheatstone bridge circuit may be subjected to tension forces and a second pair of strain gages of the example Wheatstone bridge circuit may be subjected to compression forces. The example Wheatstone bridge circuit may comprise two parallel branches, each of which comprises two series arms (i.e., two resistors in series). In one of the series arms, parameter-responsive impedance (e.g., a temperature responsive resistor) may be connected. To determine the value of the variable impedance, and therefore the value of the parameter being monitored, the Wheatstone bridge circuit may be adjusted to be in a balanced state, whereby a null voltage is developed across a diagonal of the bridge (e.g., between taps on the two branches). The example Wheatstone bridge circuit may be activated to a balanced condition either manually or automatically, by adjusting values of impedances of the bridge. After balance has been achieved, the value of the variable parameter responsive impedance may be determined. From the determined value of the parameter responsive impedance, the value of the parameter may be calculated from a known relationship between the parameter value and the impedance value of the parameter responsive impedance.

As noted above, a Wheatstone bridge circuit may be used in sensing components to detect/measure physical parameters. Compensation of sensing components that include Wheatstone bridge circuits may utilize signal conditioning circuits implemented via programmable compensation integrated circuits (ICs) (e.g., application-specific integrated circuits (ASICs), programmable amplifiers and the like). These programmable circuits facilitate digital compensation of the circuitry of the sensing component and may be configured to generate an amplified voltage output. As such, an example ASIC may operate to produce an output signal that changes proportionally with the output of the example Wheatstone bridge circuit. An example programmable amplifier may, in some examples, produce a signal in a range of approximately 0 volts to 5 volts at approximately plus or minus 1 mA of current. The example ASIC may further be configured to condition/trim an output by using stored data (e.g., stored in an electrically erasable programmable read-only memory (EEPROM)) to generate error-correction signals that are added to or subtracted from the output of the example Wheatstone bridge circuit.

In various examples, the electrical signal/output produced by an example resistance-based bridge circuit, such as a Wheatstone bridge circuit, may be miniscule and therefore detecting and/or monitoring this output within a system presents many technical challenges. For example, the example Wheatstone bridge circuit may have very large initial offset errors under a no load condition. In some examples, Wheatstone bridge circuits are manually compensated to eliminate offset errors during the manufacturing process, however manual compensation techniques may be expensive and time consuming. In some examples, a single branch (e.g., two series arm) of the example Wheatstone bridge circuit may be utilized to correct offset. However, such configurations are not suitable for providing additional diagnostics functions (e.g., detecting fault conditions). In many cases, additional dedicated circuitry may be provided for diagnostics and fault correction. However, such configurations increase the dimensions, complexity and production costs associated with the programmable circuit and/or component (e.g., sensing component).

In one example, flow sensing components may be utilized in a variety of applications including micropipetting, high-performance liquid chromatography (HPLC) applications, drug delivery, and/or the like. For example, an example flow sensing component may be implemented in an invasive or non-invasive drug delivery system to detect, measure, and/or identify a flow rate of a flowing media associated with the invasive or non-invasive drug delivery system. In such an example, an infusion pump may be implemented to deliver substance(s) (such as, but not limited to, fluids, medications and/or nutrients) into a patient's body in an invasive drug delivery system. The substance(s) may need to be delivered in controlled amounts. As such, an example flow sensing device may be implemented in the infusion pump to detect, measure, and/or identify the flow rate of substance(s) that may be delivered to the patient. In various examples, the flow rate of a flowing media may need to be precisely measured. As such, if an incorrect output is generated by an example flow sensing component comprising a resistance-based bridge circuit, a patient may be over-dosed or under-dosed, which may result in injuries and/or deaths.

In various examples, it may be difficult to detect/diagnose damage and/or a lost connection in sensing components comprising resistance-based bridge circuits (e.g., Wheatstone bridge circuits). For instance, if there is a break in connection between the example Wheatstone bridge circuit and signal conditioning circuit/programmable amplifier (e.g., ASIC), the output of the sensing circuit may go into an undefined state which may be hazardous in a variety of applications. Similarly, if a sensing element/component is damaged, the output generated by the component may be inaccurate. Additionally, a signal conditioning circuit/amplifier may have a limited input range such that it may be inefficient to utilize a substantial proportion of the available input range solely for offset correction.

In some examples, in order to detect faults, operations of an example sensing component may be periodically halted while a current is injected into the circuit. A fault or break may then be identified by detecting whether the injected current goes to ground. Since such configurations require that operations of the sensing component are halted in order to detect faults, these configurations are not optimal for a number of applications, including the drug delivery systems described above.

In accordance with various embodiments of the present disclosure, example methods, apparatuses and systems are provided.

In various embodiments, the present disclosure may provide a controller component. a resistance-based bridge circuit; a signal conditioning circuit configured to condition an output of the resistance-based bridge circuit; a first diagnostic circuit coupled to the signal conditioning circuit configured to monitor an output of a first branch of the In some examples, the controller component may comprise an ASIC or field-programmable gate array (FPGA). In some examples, the resistance-based bridge circuit may comprise a Wheatstone bridge circuit. The first branch may comprises a first two series arm of the Wheatstone bridge circuit, and the second branch may comprise a second two series arm of the Wheatstone bridge circuit. In some examples, the controller component may be configured as a flow sensing component, a pressure sensing component or a magnetic-based sensing component. In some examples, the controller component may be configured to detect a fault condition and an open connection condition. In some examples, the signal conditioning circuit may comprise a current mirror configuration. In some examples, the controller component may comprise a level-shifter element.

Using the apparatuses and techniques of the present disclosure, the ability to condition/trim an offset of a Wheatstone bridge circuit/sensing component and/or detect a lost connection between the example sensing component and a signal conditioning circuit (e.g., ASIC) is provided. Sensing components integrating such techniques are less complex than existing solutions and may be manufactured at a lower cost. Additionally, a large proportion of the amplitude input range may be preserved for operations other than offset correction. Further, faults and lost connections may be detected without ceasing operations of the example sensing component.

Figure 1:
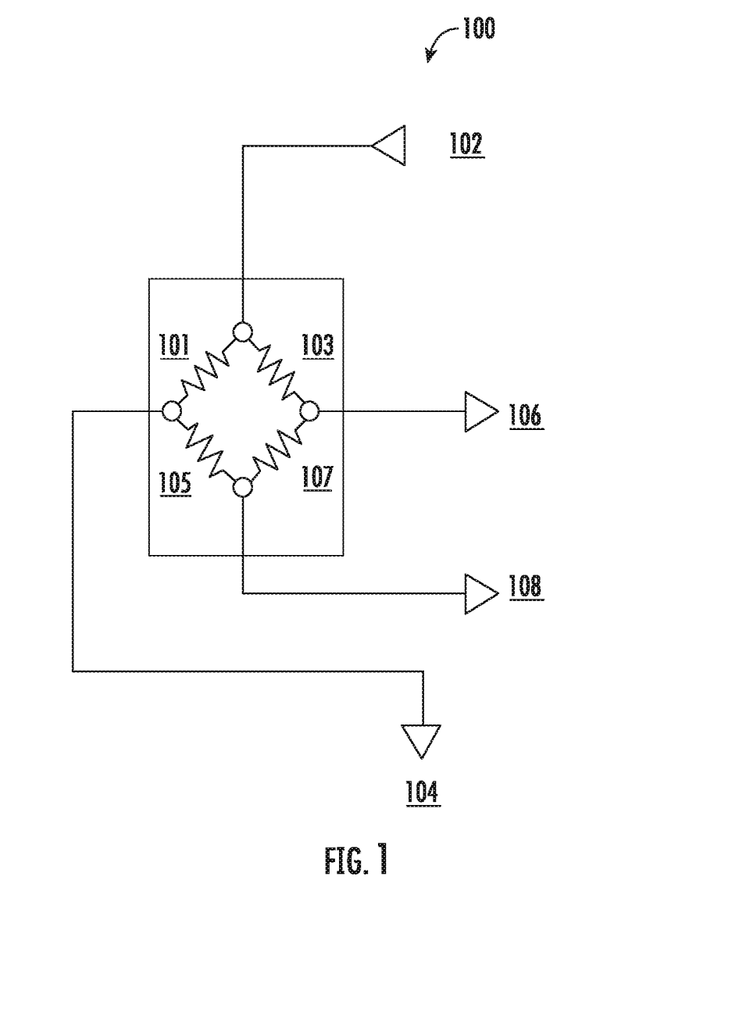
FIG. 1 illustrates an example schematic circuit diagram in accordance with various embodiments of the present disclosure.

Referring now to FIG. 1, an example schematic circuit diagram depicting an example resistance-based bridge circuit 100 in accordance with various embodiments of the present disclosure is provided. In various examples, the resistance-based bridge circuit 100 may be configured to detect/measure physical parameters. For instance, the resistance-based bridge circuit 100 may be utilized in a sensing component (e.g., pressure sensing component) to detect/measure physical parameters.

As depicted in FIG. 1, the example resistance-based bridge circuit 100 comprises a Wheatstone bridge circuit. In particular, the example resistance-based bridge circuit 100 comprises a first bridge resistor 101, a second bridge resistor 103, a third bridge resistor 105 and a fourth bridge resistor 107. As depicted, the first bridge resistor 101 and the third bridge resistor 105 may define a first branch of the resistance-based bridge circuit 100 (e.g., a first series arm). As further depicted, the second bridge resistor 103 and the fourth bridge resistor 107 may define a second branch of the resistance-based bridge circuit 100 (e.g., a second series arm). In some examples, as depicted in FIG. 1, the example resistance-based bridge circuit 100 may be connected to a voltage input/source 102 and ground 108. Additionally, as depicted, the example resistance-based bridge circuit 100 may comprise/define a positive output terminal/node 104 and a negative output terminal/node 106 for connecting to other processing circuitry (e.g., an ASIC). The example resistance-based bridge circuit 100 may provide electrical signal(s) indicative of a detected physical parameter (e.g., to the example ASIC) for further processing.

While some of the embodiments herein provide an example resistance-based bridge circuit 100, it is noted that the present disclosure is not limited to such embodiments. For instance, in some examples, a resistance-based bridge circuit 100 in accordance with the present disclosure may comprise one or more additional and/or alternative elements, and/or may be structured/positioned differently than that illustrated in FIG. 1.

Figure 2:
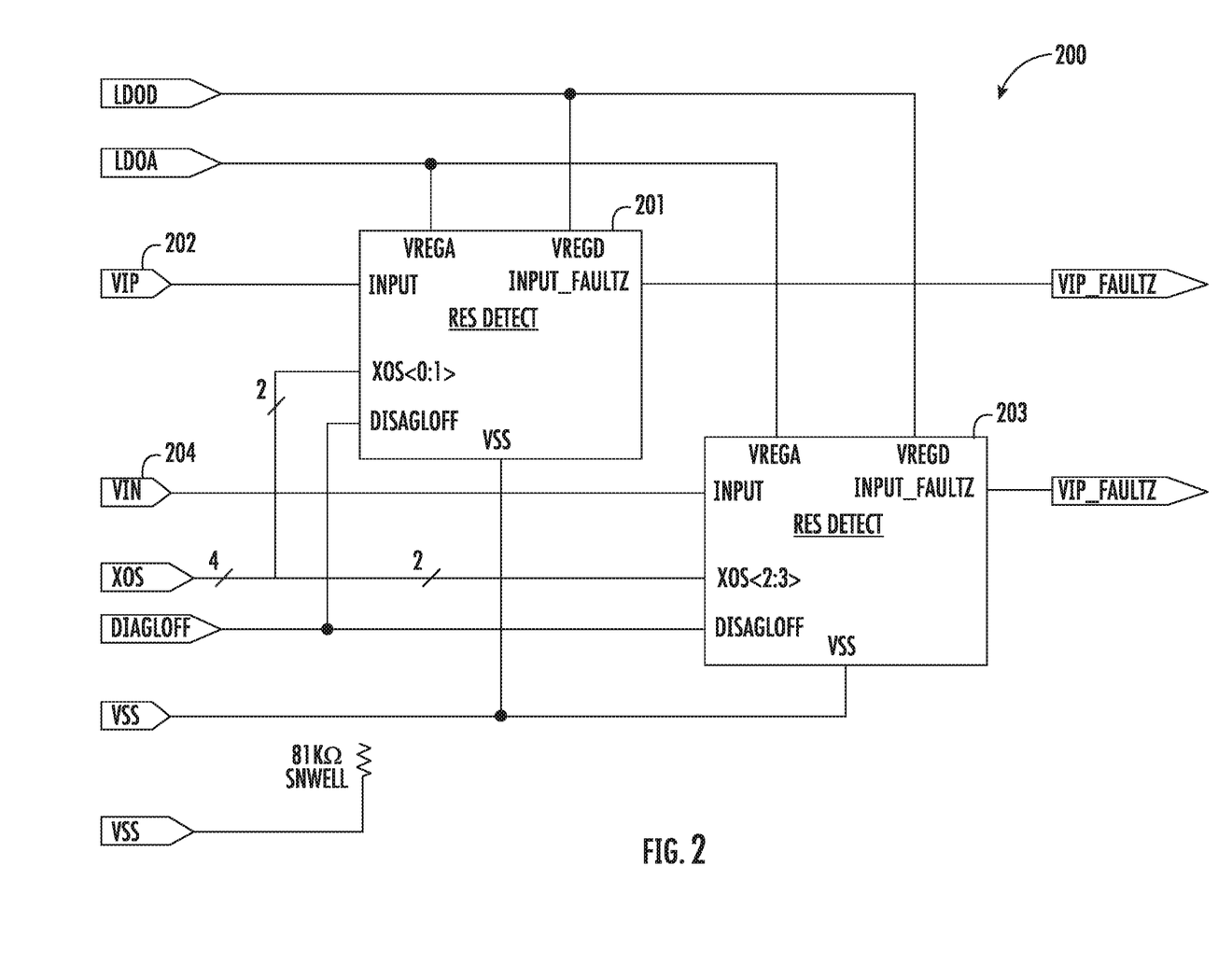
FIG. 2 illustrates an example schematic circuit diagram in accordance with various embodiments of the present disclosure.

Referring now to FIG. 2, an example schematic circuit diagram depicting at least a portion of a controller component 200 (e.g., an ASIC) in accordance with various embodiments of the present disclosure is provided. In particular, as depicted, the portion of the example controller component 200 comprises a first diagnostic circuit 201 and a second diagnostic circuit 203. In various embodiments, each of the first diagnostic circuit 201 and the second diagnostic circuit 203 may be configured to detect an output of a respective branch (e.g., two series arm) of an example resistance-based bridge circuit (e.g., Wheatstone bridge circuit). For example, as depicted, the first diagnostic circuit 201 may be connected to a positive terminal 202 of a first branch of the example resistance-based bridge circuit (e.g., Wheatstone bridge circuit). Similar, as further depicted, the second diagnostic circuit 203 may be connected to a negative terminal 204 of a second branch of the example resistance-based bridge circuit (e.g., Wheatstone bridge circuit). Since the example controller component 200 is configured to simultaneously monitor both branches of the example resistance-based bridge circuit (e.g., Wheatstone bridge circuit), it may thus be utilized to detect whether the connection between the resistance-based bridge circuit (e.g., Wheatstone bridge circuit) and the controller component/processing circuitry has failed. For example, the example controller component 200 may be configured to detect that a wire bond has opened to a high resistance condition or that an example diaphragm of a pressure sensing component has been damaged.

While some of the embodiments herein provide an example controller component 200, it is noted that the present disclosure is not limited to such embodiments. For instance, in some examples, an example controller component 200 in accordance with the present disclosure may comprise one or more additional and/or alternative elements, and/or may be structured/positioned differently than that illustrated in FIG. 2.

Figure 3:
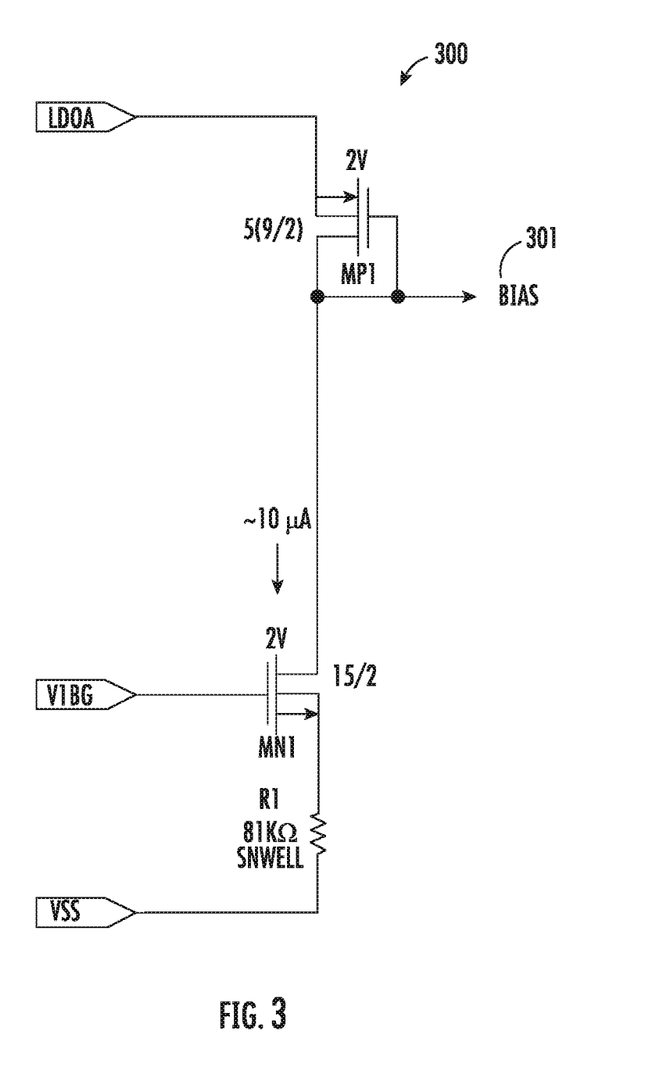
FIG. 3 illustrates an example schematic circuit diagram in accordance with various embodiments of the present disclosure.

Referring now to FIG. 3, an example schematic circuit diagram depicting an example diagnostic current source 300 in accordance with various embodiments of the present disclosure is provided. In various embodiments, the example diagnostic current source 300 may form part of/be integrated with other circuitry (e.g., an example ASIC). As depicted, the example diagnostic current source 300 may be configured to generate a bias voltage 301 of a particular voltage value in order to generate currents within the system. For example, as depicted, the example diagnostic current source 300 may operate by generating a bias voltage which may be used to generate currents that are utilized to adjust the offset of an example resistance-based bridge circuit (e.g., Wheatstone bridge circuit).

While some of the embodiments herein provide an example diagnostic current source 300, it is noted that the present disclosure is not limited to such embodiments. For instance, in some examples, an example diagnostic current source 300 in accordance with the present disclosure may comprise one or more additional and/or alternative elements, and/or may be structured/positioned differently than that illustrated in FIG. 3.

Figure 4:
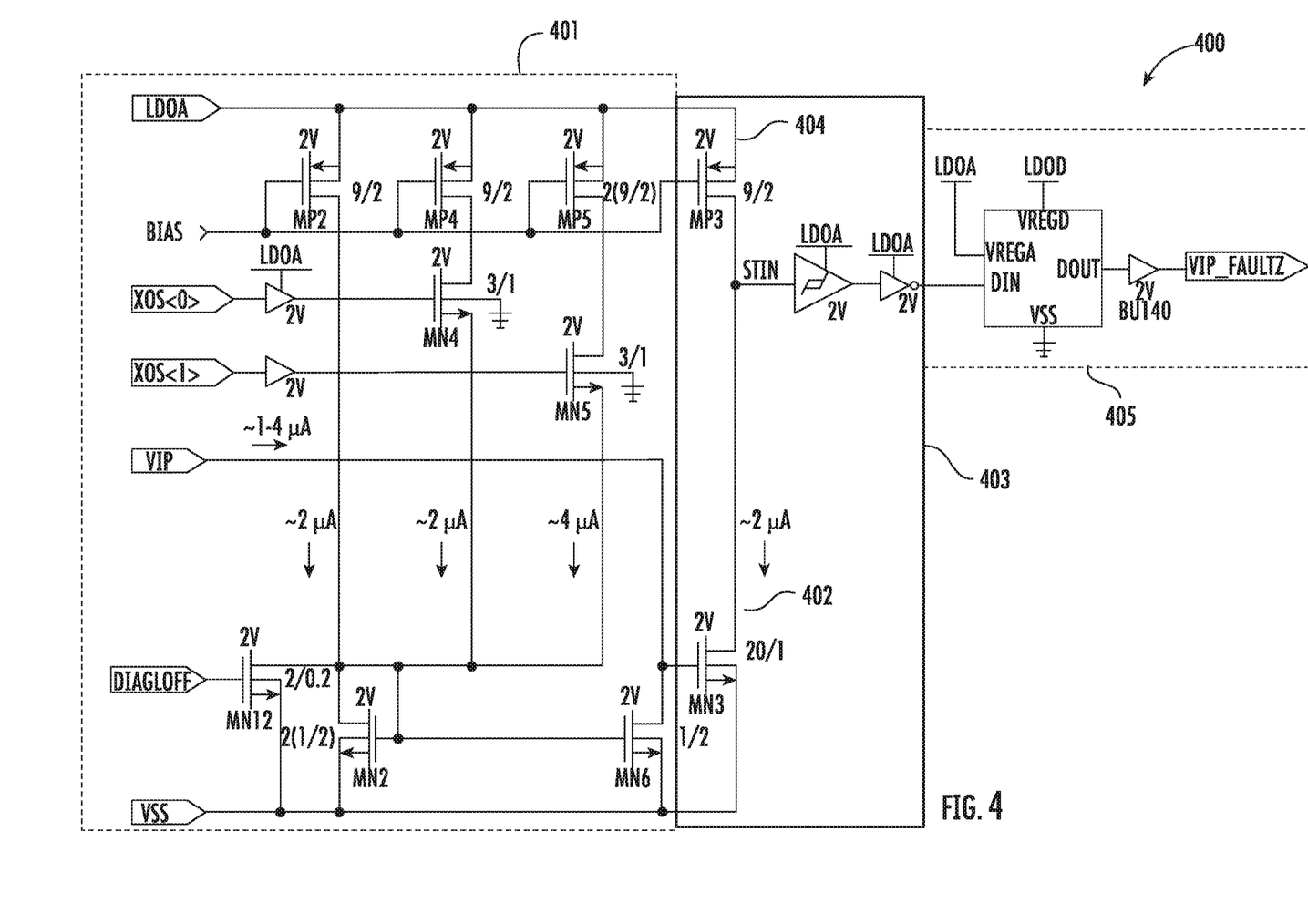
FIG. 4 illustrates an example schematic circuit diagram in accordance with various embodiments of the present disclosure.

Referring now to FIG. 4, an example schematic circuit diagram depicting at least a portion of an example controller component 400 (e.g., an ASIC) is provided. The example controller component 400 may be similar or identical to the example controller component 200 discussed above in connection with FIG. 1. In particular, as depicted, the example controller component 400 comprises a signal conditioning circuit 401, a first diagnostic circuit 403 and a level-shifter element 405. The example controller component 400 may operate to trim an output of an example resistance-based bridge circuit (e.g., Wheatstone bridge circuit) while performing self-diagnostic functions. In various embodiments, the example controller component 400 may form part of or be otherwise integrated with a sensing component (e.g., flow sensing component, pressure sensing component or the like).

As depicted in FIG. 4, the example controller component 400 comprises at least a portion of a signal conditioning circuit 401. As noted above, the signal conditioning circuit 401 may operate to trim the output of an example resistance-based bridge circuit (e.g., Wheatstone bridge circuit), i.e., provide a trim current. For example, the example controller component 400 may be configured to condition an output of a first branch (e.g., two series arm) of an example Wheatstone bridge circuit. As depicted in FIG. 4, the signal conditioning circuit 401 comprises/defines a current mirror configured to mirror an input current so as to generate a final output current (e.g., between 1-4 µA) and thus operates to control an offset current value. In various embodiments, the example signal conditioning circuit 401 may operate to double or quadruple an input current value. Additionally, as depicted the signal conditioning circuit 401 (i.e., current mirror) is configured to provide an input current to the first diagnostic circuit 403.

As depicted in FIG. 4, the example controller component 400 comprises a first diagnostic circuit 403. As depicted, the first diagnostic circuit 403 comprises a first transistor element 402 and a second transistor element 404 In various examples, the first diagnostic circuit 403 may be configured to perform self-diagnostic functions and/or detect faults. For example, if around mid-scale, the first transistor element 402 may be on. In some examples, due to characteristic differences between the first transistor element 402 and the second transistor element 404, the output voltage may be pulled low, buffered and inverted thus providing active low-fault detection. For example, the output of the first diagnostic circuit 403 may be in an active low state such that the first diagnostic circuit 403 is configured to transition to near ground in an instance in which an open connection is detected. As a result of the active-low configuration, in the event of an open connection, the output of the signal conditioning circuit 401 may pull a first transistor element 402 down and pull a second transistor element 404 high thereby determining whether no bridge electrical output/signal is present. By way of example, in relation to an example sensing component, the first diagnostic circuit 403 may be configured to detect that a wire bond has opened to a high resistance condition or that an example diaphragm of a sensing component is damaged.

In some examples, the first diagnostic circuit 403 may be buffered with ×40 components (i.e., 4× drive capability) in order to drive across-chip interconnect capacitance. Accordingly, if the Thevenin resistance of the bridge output is sufficiently low, then the first diagnostic circuit 403 may switch from the low state to the high state. In various examples, the low to high switchpoint may be an "Operate" (OP) point. The first diagnostic circuit 403 (e.g., resistance detectors of the first diagnostic circuit 403) may operate in a unipolar fashion so that as a connection opens, the first diagnostic circuit 403 switches from the high state to the low state. The high to low switchpoint may be a "Release" (REL) point. The difference between the OP point and the REL point may be a "Differential" (DIF) representing the hysteresis or amount of noise the first diagnostic circuit 403 can tolerate without chattering. The first diagnostic circuit 403 may operate as a coarse adjust to reduce the 25° C. bridge offset voltage distribution by at least 50% without greatly increasing the offset voltage shift over temperature.

In various embodiments, as depicted in FIG. 4, the example controller component 400 comprises a level-shifter element 405 configured to translate an electrical output/signal from an analog supply domain to a digital supply domain. Additionally, in various examples, the controller component 400 may comprise an analog-to-digital converter element.

While some of the embodiments herein provide an example controller component 400, it is noted that the present disclosure is not limited to such embodiments. For instance, in some examples, an example controller component 400 in accordance with the present disclosure may comprise one or more additional and/or alternative elements, and/or may be structured/positioned differently than that illustrated in FIG. 4.

Figure 5:
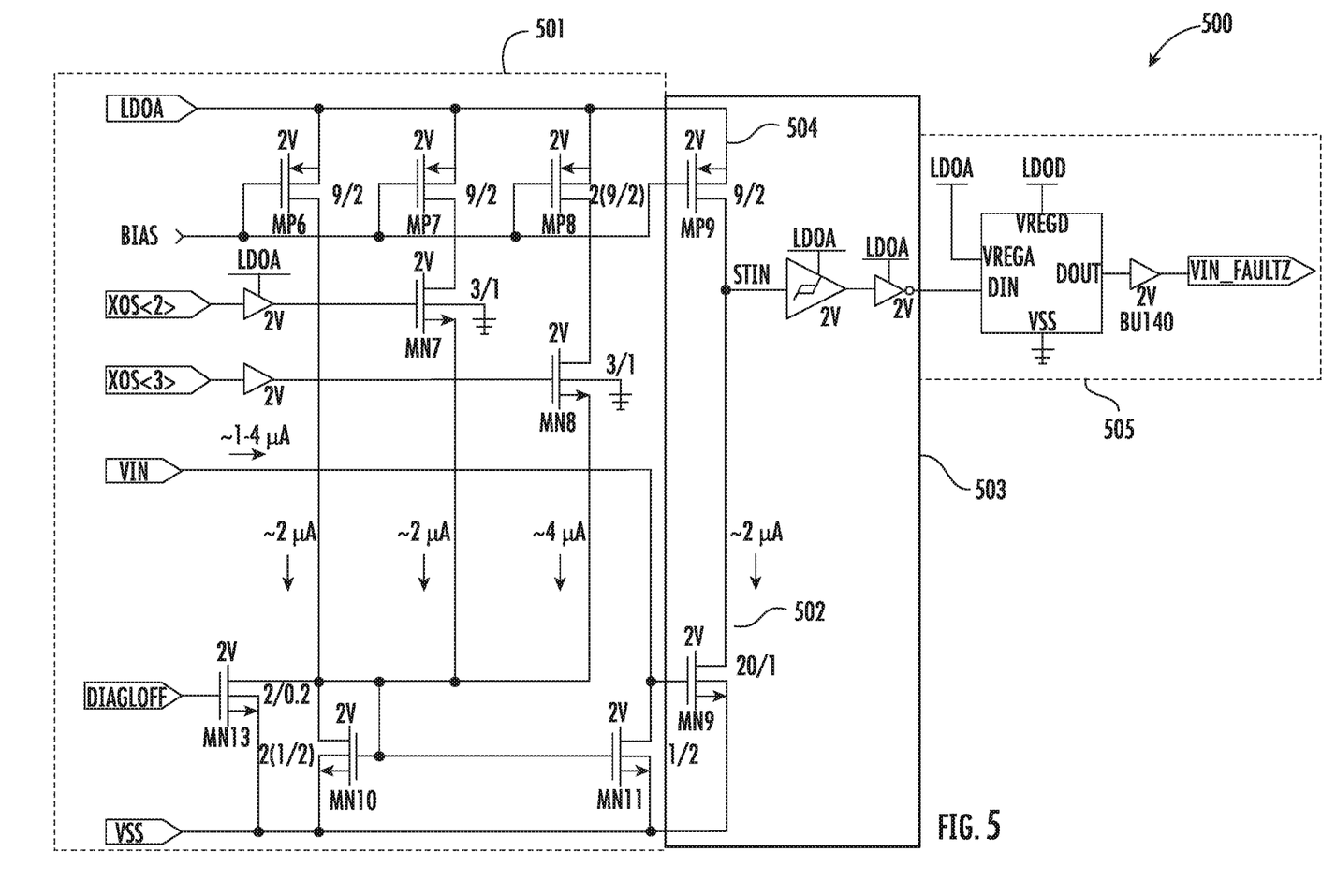
FIG. 5 illustrates an example schematic circuit diagram in accordance with various embodiments of the present disclosure.

Referring now to FIG. 5, an example schematic circuit diagram depicting at least a portion of an example controller component 500 (e.g., an ASIC) is provided. The example controller component 500 may be similar or identical to the example controller component 400 discussed above in connection with FIG. 4. In particular, as depicted, the example controller component 500 comprises a signal conditioning circuit 501, a second diagnostic circuit 503 and a level-shifter element 505. The example controller component 500 may operate to trim an output of an example resistance-based bridge circuit (e.g., Wheatstone bridge circuit) while performing self-diagnostic functions. In various embodiments, the example controller component 500 may form part of or be otherwise integrated with a sensing component (e.g., flow sensing component, pressure sensing component and the like).

As depicted in FIG. 5, the example controller component 500 comprises a portion of a signal conditioning circuit 501. As noted above, the signal conditioning circuit 501 may operate to trim the output of an example resistance-based bridge circuit (e.g., Wheatstone bridge circuit), i.e., provide a trim current. For example, the example controller component 500 may be configured to condition an output of a second branch (e.g., two series arm) of an example Wheatstone bridge circuit. As depicted in FIG. 5, the signal conditioning circuit 501 comprises/defines a current mirror configured to mirror an input current so as to generate a final output current (e.g., between 1-4 µA) and thus operates to control an offset current value. In various embodiments, the example signal conditioning circuit 501 may operate to double or quadruple an input current value. Additionally, as depicted the signal conditioning circuit 501 (i.e., current mirror) is configured provide a current to the second diagnostic circuit 503.

As depicted in FIG. 5, the example controller component 500 comprises a second diagnostic circuit 503. As depicted, the second diagnostic circuit 503 comprises a first transistor element 502 and a second transistor element 504 In various examples, the second diagnostic circuit 503 may be configured to perform self-diagnostic functions and/or detect faults. For example, if around mid-scale, the first transistor element 502 may be on. In some examples, due to characteristic differences between the first transistor element 502 and the second transistor element 504, the output voltage may be pulled low, buffered and inverted thus providing active low-fault detection. For example, the output of the second diagnostic circuit 503 may be in an active low state such that the second diagnostic circuit 503 is configured to transition to near ground in an instance in which an open connection is detected. As a result of the active-low configuration, in the event of an open connection, the output of the signal conditioning circuit 501 may pull a first transistor element 502 down and pull a second transistor element 504 high thereby determining whether no bridge output is present. By way of example, in relation to a sensing component, the second diagnostic circuit 503 may be configured to detect that a wire bond has opened to a high resistance condition or that an example diaphragm of a sensing component is damaged.

In some examples, the second diagnostic circuit 503 may be buffered with ×40 components (i.e., 4× drive capability) in order to drive across-chip interconnect capacitance. Accordingly, if the Thevenin resistance of the bridge output is sufficiently low, then the second diagnostic circuit 503 may switch from the low state to the high state. In various examples, the low to high switchpoint may be an "Operate" (OP) point. The second diagnostic circuit 503 (e.g., resistance detectors of the second diagnostic circuit 503) may operate in a unipolar fashion so that as a connection opens, the second diagnostic circuit 503 switches from the high state to the low state. The high to low switchpoint may be a "Release" (REL) point. The difference between the OP point and the REL point may be a "Differential" (DIF) representing the hysteresis or amount of noise the second diagnostic circuit 503 can tolerate without chattering. The second diagnostic circuit 503 may operate as a coarse adjust to reduce the 25° C. bridge offset voltage distribution by at least 50% without greatly increasing the offset voltage shift over temperature.

In various embodiments, as depicted in FIG. 5, the example controller component 500 comprises a level-shifter element 505 configured to translate an electrical signal/output from an analog supply domain to a digital supply domain.

While some of the embodiments herein provide an example controller component 500, it is noted that the present disclosure is not limited to such embodiments. For instance, in some examples, an example controller component 500 in accordance with the present disclosure may comprise other elements one or more additional and/or alternative elements, and/or may be structured/positioned differently than that illustrated in FIG. 5.

Figure 6:
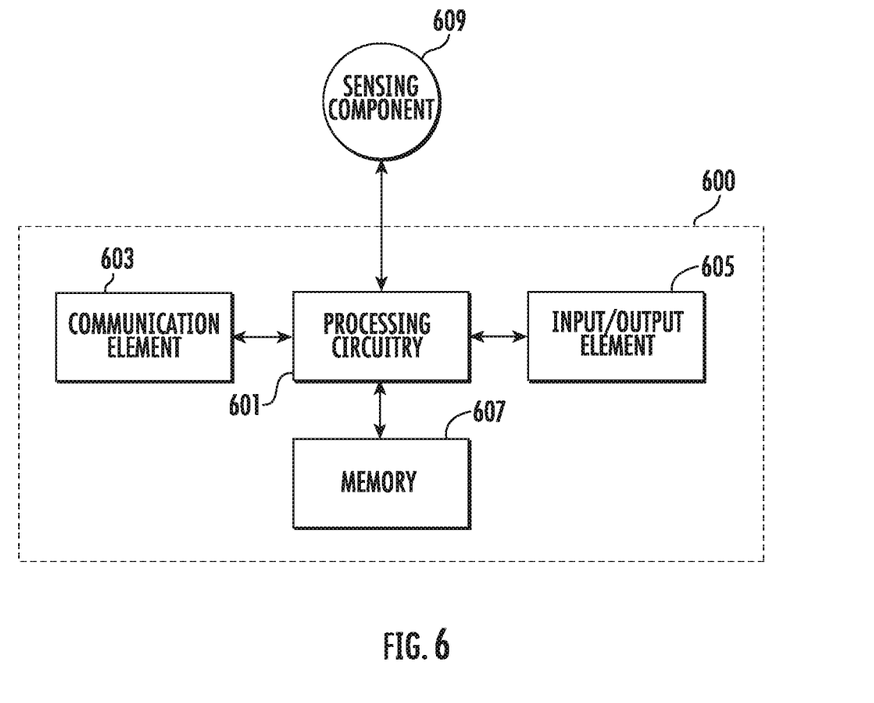
FIG. 6 illustrates an example controller component in accordance with various embodiments of the present disclosure.

Referring now to FIG. 6, a schematic diagram depicting an example controller component 600 in electronic communication with a sensing component 609 (e.g., flow sensing component, pressure sensing component or the like) in accordance with various embodiments of the present disclosure is provided. As shown, the controller component 600 comprises processing circuitry 601, a communication element 603, input/output element 605, a memory 607 and/or other components configured to perform various operations, procedures, functions or the like described herein. In some examples, the controller component 600 may be operatively coupled with the sensing component or remote from the sensing component 609.

As depicted, the controller component 600 (such as the processing circuitry 601, communication element 603, input/output element 605 and memory 607) is electrically coupled to and/or in electronic communication with a sensing component 609. The sensing component 609 may exchange (e.g., transmit and receive) data in the form of electrical signals with the processing circuitry 601 of the controller component 600.

The processing circuitry 601 may be implemented as, for example, various devices comprising one or a plurality of microprocessors with accompanying digital signal processors; one or a plurality of processors without accompanying digital signal processors; one or a plurality of coprocessors; one or a plurality of multi-core processors; one or a plurality of controllers; processing circuits; one or a plurality of computers; and various other processing elements (including integrated circuits, such as an ASIC or field-programmable gate arrays (FPGAs), or a certain combination thereof). In some embodiments, the processing circuitry 601 may comprise one or more processors. In one exemplary embodiment, the processing circuitry 601 is configured to execute instructions stored in the memory 607 or otherwise accessible by the processing circuitry 601. When executed by the processing circuitry 601, these instructions may enable the controller component 600 to execute one or a plurality of the functions as described herein. Whether it is configured by hardware, firmware/software methods, or a combination thereof, the processing circuitry 601 may comprise entities capable of executing operations according to the embodiments of the present invention when correspondingly configured. Therefore, for example, when the processing circuitry 601 is implemented as an ASIC, an FPGA, or the like, the processing circuitry 601 may comprise specially configured hardware for implementing one or a plurality of operations described herein. Alternatively, as another example, when the processing circuitry 601 is implemented as an actuator of instructions (such as those that may be stored in the memory 607), the instructions may specifically configure the processing circuitry 601 to execute one or a plurality of algorithms and operations, some of which are described herein.

The memory 607 may comprise, for example, a volatile memory, a non-volatile memory, or a certain combination thereof. Although illustrated as a single memory in FIG. 5, the memory 607 may comprise a plurality of memory components. In various embodiments, the memory 607 may comprise, for example, a hard disk drive, a random access memory, EEPROM, a cache memory, a flash memory, an optical disk, a circuit configured to store information, or a certain combination thereof. The memory 607 may be configured to store information, data, application programs, instructions, and etc., so that the controller component 600 can execute various functions according to the embodiments of the present disclosure. For example, in at least some embodiments, the memory 607 is configured to cache input data for processing by the processing circuitry 601. Additionally or alternatively, in at least some embodiments, the memory 607 is configured to store program instructions for execution by the processing circuitry 601. The memory 607 may store information in the form of static and/or dynamic information. When the functions are executed, the stored information may be stored and/or used by the controller component 600.

The communication element 603 may be implemented as any apparatus included in a circuit, hardware, a computer program product or a combination thereof, which is configured to receive and/or transmit data from/to another component or apparatus. The computer program product comprises computer-readable program instructions stored on a computer-readable medium (for example, the memory 607) and executed by a controller component 600 (for example, the processing circuitry 601). In some embodiments, the communication element 603 (as with other components discussed herein) may be at least partially implemented as the processing circuitry 601 or otherwise controlled by the processing circuitry 601. In this regard, the communication element 603 may communicate with the processing circuitry 601, for example, through a bus. The communication element 603 may comprise, for example, antennas, transmitters, receivers, transceivers, network interface cards and/or supporting hardware and/or firmware/software, and is used for establishing communication with another apparatus. The communication element 603 may be configured to receive and/or transmit any data that may be stored by the memory 607 by using any protocol that can be used for communication between apparatuses. The communication element 603 may additionally or alternatively communicate with the memory 607, the input/output element 605 and/or any other component of the controller component 600, for example, through a bus.

In some embodiments, the controller component 600 may comprise an input/output element 605. The input/output element 605 may communicate with the processing circuitry 601 to receive instructions input by the user and/or to provide audible, visual, mechanical or other outputs to the user. Therefore, the input/output element 605 may be in electronic communication with supporting devices, such as a keyboard, a mouse, a display, a touch screen display, and/or other input/output mechanisms. Alternatively, at least some aspects of the input/output element 605 may be implemented on a device used by the user to communicate with the controller component 600. The input/output element 605 may communicate with the memory 607, the communication element 603 and/or any other component, for example, through a bus. One or a plurality of input/output elements and/or other components may be included in the controller component 600. In various examples, the example sensing component 609 may generate electrical outputs/signals comprising information/data and transmit electrical outputs/signals to the processing circuitry 601. The example sensing component 609 may generate system information and transmit indications (e.g., electrical signals describing the system information) to the processing circuitry 601.

Many modifications and other embodiments of the present disclosure set forth herein will come to mind to one skilled in the art to which these embodiments pertain having the benefit of the teachings presented in the foregoing descriptions and the associated drawings. Therefore, it is to be understood that the disclosure are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

The invention claimed is:

1. A controller component comprising:
   a resistance-based bridge circuit;
   a signal conditioning circuit configured to condition an output of the resistance-based bridge circuit;
   a first diagnostic circuit coupled to the signal conditioning circuit configured to monitor an output of a first branch of the resistance-based bridge circuit; and
   a second diagnostic circuit coupled to the signal conditioning circuit configured to monitor an output of a second branch of the resistance-based bridge circuit,
   wherein each of the first diagnostic circuit and the second diagnostic circuit comprises two transistors; and
   wherein the controller component comprises a level-shifter element configured to translate an electrical signal/output from an analog supply domain to a digital supply domain; and
   wherein the controller is configured to detect a fault condition and an open connection condition by monitoring output of the first and second diagnostic circuit, wherein each of the first and second diagnostic circuit is configured to pull low, buffer, and invert output voltage to provide active low-fault detection.

2. The controller component of claim 1, wherein the controller component comprises an application-specific integrated circuit (ASIC) or field-programmable gate array (FPGA).

3. The controller component of claim 1, wherein the resistance-based bridge circuit comprises a Wheatstone bridge circuit.

4. The controller component of claim 3, wherein the first branch comprises a first two series arm of the Wheatstone bridge circuit, and the second branch comprises a second two series arm of the Wheatstone bridge circuit.

5. The controller component of claim 1, wherein the controller component is configured as a flow sensing component.

6. The controller component of claim 1, wherein the controller component is configured as a pressure sensing component.

7. The controller component of claim 1, wherein the controller component is configured as a magnetic-based sensing component.

8. The controller component of claim 1, wherein the controller component is configured to detect a fault condition and an open connection condition.

9. The controller component of claim 1, wherein the signal conditioning circuit comprises a current mirror configuration.

10. A method for providing offset calibration and detecting fault conditions using a controller component the method comprising:
    monitoring, by a first diagnostic circuit of the controller component, a first branch of a resistance-based bridge circuit; and
    monitoring, by a second diagnostic circuit of the controller component, a second branch of the resistance-based bridge circuit,
    wherein each of the first diagnostic circuit and the second diagnostic circuit comprises two transistors,
    wherein the first diagnostic circuit and the second diagnostic circuit are electronically coupled to a signal conditioning circuit of the controller component, and the signal conditioning circuit is configured to condition an output of the resistance-based bridge circuit; and wherein the controller component comprises a level-shifter element configured to translate an electrical signal/output from an analog supply domain to a digital supply domain; and wherein the controller is configured to detect a fault condition and an open connection condition by monitoring output of the first and second diagnostic circuit, wherein each of the first and second diagnostic circuit is configured to pull low, buffer, and invert output voltage to provide active low-fault detection.

11. The method of claim 10, wherein the controller component comprises an ASIC or field-programmable gate array FPGA.

12. The method of claim 10, wherein the resistance-based bridge circuit comprises a Wheatstone bridge circuit.

13. The method of claim 12, wherein the first branch comprises a first two series arm of the Wheatstone bridge circuit, and the second branch comprises a second two series arm of the Wheatstone bridge circuit.

14. The method of claim 10, wherein the controller component is configured as a flow sensing component.

15. The method of claim 10, wherein the controller component is configured as a pressure sensing component.

16. The method of claim 10, wherein the controller component is configured as a magnetic-based sensing component.

17. The method of claim 10, wherein the controller component is configured to detect a fault condition and an open connection condition.

18. The method of claim 10, wherein the signal conditioning circuit comprises a current mirror configuration.

* * * * *